US008014196B2

(12) United States Patent
Graef

(10) Patent No.: US 8,014,196 B2
(45) Date of Patent: Sep. 6, 2011

(54) REDUCED-POWER PROGRAMMING OF MULTI-LEVEL CELL (MLC) MEMORY

(75) Inventor: Nils Graef, Milpitas, CA (US)

(73) Assignee: Agere Systems Inc., Allentown, PA (US)

( * ) Notice: Subject to any disclaimer, the term of this patent is extended or adjusted under 35 U.S.C. 154(b) by 584 days.

(21) Appl. No.: 12/200,129

(22) Filed: Aug. 28, 2008

(65) Prior Publication Data

US 2010/0057977 A1 Mar. 4, 2010

(51) Int. Cl.
G11C 16/06 (2006.01)
G11C 16/10 (2006.01)
G11C 16/12 (2006.01)
G11C 16/26 (2006.01)

(52) U.S. Cl. ......... 365/185.03; 365/185.17; 365/185.18; 365/185.24; 711/103

(58) Field of Classification Search ............. 365/185.03, 365/185.17, 185.18, 185.19, 185.24; 711/103
See application file for complete search history.

(56) References Cited

U.S. PATENT DOCUMENTS

| 6,292,868 | B1 * | 9/2001 | Norman | ......................... 711/103 |
| 2008/0055998 | A1 | 3/2008 | Jung et al. | |
| 2009/0106482 | A1 * | 4/2009 | Sarin et al. | .................... 711/103 |

OTHER PUBLICATIONS

Yongsoo Joo, et al., "Energy-Aware Data Compression for Multi-Level Cell (MLC) Flash Memory," Design Automation Conference 2007. DAC '07. 44th ACM/IEEE, Jun. 4-8, 2007, San Diego, California, USA., Copyright 2007, ISSN: 0738-100X, ISBN: 978-1-59593-627-1, INSPEC Accession No. 9867035, published Jun. 25, 2007 10:10:00.0, pp. 716-719.

* cited by examiner

*Primary Examiner* — J. H. Hur
(74) *Attorney, Agent, or Firm* — Mendelsohn, Drucker & Associates, P.C.; Edward J. Meisarosh; Steve Mendelsohn

(57) ABSTRACT

In one embodiment, a mobile electronic device has a host controller, an energy-saving encoder, an energy-saving decoder, and a multi-level cell (MLC) NAND flash memory. The host controller provides raw user data to the energy-saving encoder in k-bit segments. The energy-saving encoder encodes each k-bit segment into an n-bit segment of encoded user data for programming the MLC NAND flash memory as a p-symbol codeword, where (i) k is smaller than n (ii) p(=n/$\log_2$ m) MLCs are used to store the p-symbol codeword (iii) each MLC stores one symbol of the codeword. The energy-saving decoder is adapted to read p-symbol codewords from the MLC NAND flash memory and decode each p-symbol codeword into a k-bit segment of raw user data for provision to the host controller. The host controller is adapted to vary k and n to conserve usage of power or memory-space, as needed.

20 Claims, 7 Drawing Sheets

TABLE 9

| 5-BIT SEGMENT OF RAW USER DATA | CORRESPONDING 3-SYMBOL (6-BIT) CODEWORD | PROGRAMMING ENERGY |
|---|---|---|
| 00000 | 000 | 0E |
| 00001 | 001 | |
| 00010 | 010 | 1E |
| 00011 | 100 | |
| 00100 | 200 | |
| 00101 | 002 | |
| 00110 | 011 | 2E |
| 00111 | 020 | |
| 01000 | 101 | |
| 01001 | 110 | |
| 01010 | 201 | |
| 01011 | 210 | |
| 01100 | 300 | |
| 01101 | 003 | |
| 01110 | 012 | 3E |
| 01111 | 021 | |
| 10000 | 030 | |
| 10001 | 102 | |
| 10010 | 111 | |
| 10011 | 120 | |
| 10100 | 202 | |
| 10101 | 211 | |
| 10110 | 220 | |
| 10111 | 301 | |
| 11000 | 310 | |
| 11001 | 013 | 4E |
| 11010 | 022 | |
| 11011 | 031 | |
| 11100 | 103 | |
| 11101 | 112 | |
| 11110 | 121 | |
| 11111 | 130 | |

TABLE 1

| 2-SYMBOL (4-BIT) CODEWORD | ENERGY, IN E UNITS, REQUIRED TO STORE THE CODEWORD IN TWO 4-LEVEL CELLS |
|---|---|
| 00 | 0 |
| 01 | 1 |
| 02 | 2 |
| 03 | 3 |
| 10 | 1 |
| 11 | 2 |
| 12 | 3 |
| 13 | 4 |
| 20 | 2 |
| 21 | 3 |
| 22 | 4 |
| 23 | 5 |
| 30 | 3 |
| 31 | 4 |
| 32 | 5 |
| 33 | 6 |

FIG. 4

TABLE 2

| 2-SYMBOL (4-BIT) CODEWORD | ENERGY, IN E UNITS, REQUIRED TO STORE THE CODEWORD IN TWO 4-LEVEL CELLS |
|---|---|
| 00 | 0 |
| 01 | 1 |
| 10 | |
| 02 | 2 |
| 11 | |
| 20 | |
| 03 | 3 |
| 12 | |
| 21 | |
| 30 | |
| 13 | 4 |
| 22 | |
| 31 | |
| 23 | 5 |
| 32 | |
| 33 | 6 |

FIG. 5

TABLE 3

| 2-BIT SEGMENT OF RAW USER DATA | CORRESPONDING 2-SYMBOL (4-BIT) CODEWORD | PROGRAMMING ENERGY |
|---|---|---|
| 00 | 00 | 0E |
| 01 | 01 | 1E |
| 10 | 10 | |
| 11 | 02 | 2E |

FIG. 6

TABLE 4

| 3-BIT SEGMENT OF RAW USER DATA | CORRESPONDING 2-SYMBOL CODEWORD | PROGRAMMING ENERGY |
|---|---|---|
| 000 | 00 | 0E |
| 001 | 01 | 1E |
| 010 | 10 | |
| 011 | 02 | |
| 100 | 11 | 2E |
| 101 | 20 | |
| 110 | 03 | 3E |
| 111 | 12 | |

FIG. 7  TABLE 5

| 3-SYMBOL (6-BIT) CODEWORD | ENERGY REQUIRED TO STORE THE CODEWORD IN THREE 4-LEVEL CELLS |
|---|---|
| 000 | 0E |
| 001 | 1E |
| 010 | |
| 100 | |
| 200 | 2E |
| 002 | |
| 011 | |
| 020 | |
| 101 | |
| 110 | |
| 201 | 3E |
| 210 | |
| 300 | |
| 003 | |
| 012 | |
| 021 | |
| 030 | |
| 102 | |
| 111 | |
| 120 | |
| 202 | 4E |
| 211 | |
| 220 | |
| 301 | |
| 310 | |
| 013 | |
| 022 | |
| 031 | |
| 103 | |
| 112 | |
| 121 | |
| 130 | |

| 3-SYMBOL (6-BIT) CODEWORD | ENERGY REQUIRED TO STORE THE CODEWORD IN THREE 4-LEVEL CELLS |
|---|---|
| 203 | 5E |
| 212 | |
| 221 | |
| 230 | |
| 302 | |
| 311 | |
| 320 | |
| 023 | |
| 032 | |
| 113 | |
| 122 | |
| 131 | |
| 213 | 6E |
| 222 | |
| 231 | |
| 303 | |
| 312 | |
| 321 | |
| 330 | |
| 033 | |
| 123 | |
| 132 | |
| 223 | 7E |
| 232 | |
| 313 | |
| 322 | |
| 331 | |
| 133 | |
| 233 | 8E |
| 323 | |
| 332 | |
| 333 | 9E |

FIG. 8

TABLE 6

| 2-BIT SEGMENT OF RAW USER DATA | CORRESPONDING 3-SYMBOL (6-BIT) CODEWORD | PROGRAMMING ENERGY |
|---|---|---|
| 00 | 000 | 0E |
| 01 | 001 | 1E |
| 10 | 010 | |
| 11 | 100 | |

FIG. 9

TABLE 7

| 3-BIT SEGMENT OF RAW USER DATA | CORRESPONDING 3-SYMBOL (6-BIT) CODEWORD | PROGRAMMING ENERGY |
|---|---|---|
| 000 | 000 | 0E |
| 001 | 001 | 1E |
| 010 | 010 | |
| 011 | 100 | |
| 100 | 200 | 2E |
| 101 | 002 | |
| 110 | 011 | |
| 111 | 020 | |

FIG. 10
TABLE 8

| 4-BIT SEGMENT OF RAW USER DATA | CORRESPONDING 3-SYMBOL (6-BIT) CODEWORD | PROGRAMMING ENERGY |
|---|---|---|
| 0000 | 000 | 0E |
| 0001 | 001 | 1E |
| 0010 | 010 | 1E |
| 0011 | 100 | 1E |
| 0100 | 200 | 2E |
| 0101 | 002 | 2E |
| 0110 | 011 | 2E |
| 0111 | 020 | 2E |
| 1000 | 101 | 2E |
| 1001 | 110 | 2E |
| 1010 | 201 | 3E |
| 1011 | 210 | 3E |
| 1100 | 300 | 3E |
| 1101 | 003 | 3E |
| 1110 | 012 | 3E |
| 1111 | 021 | 3E |

FIG. 11

TABLE 9

| 5-BIT SEGMENT OF RAW USER DATA | CORRESPONDING 3-SYMBOL (6-BIT) CODEWORD | PROGRAMMING ENERGY |
|---|---|---|
| 00000 | 000 | 0E |
| 00001 | 001 | 1E |
| 00010 | 010 | 1E |
| 00011 | 100 | 1E |
| 00100 | 200 | 2E |
| 00101 | 002 | 2E |
| 00110 | 011 | 2E |
| 00111 | 020 | 2E |
| 01000 | 101 | 2E |
| 01001 | 110 | 2E |
| 01010 | 201 | 3E |
| 01011 | 210 | 3E |
| 01100 | 300 | 3E |
| 01101 | 003 | 3E |
| 01110 | 012 | 3E |
| 01111 | 021 | 3E |
| 10000 | 030 | 3E |
| 10001 | 102 | 3E |
| 10010 | 111 | 3E |
| 10011 | 120 | 3E |
| 10100 | 202 | 4E |
| 10101 | 211 | 4E |
| 10110 | 220 | 4E |
| 10111 | 301 | 4E |
| 11000 | 310 | 4E |
| 11001 | 013 | 4E |
| 11010 | 022 | 4E |
| 11011 | 031 | 4E |
| 11100 | 103 | 4E |
| 11101 | 112 | 4E |
| 11110 | 121 | 4E |
| 11111 | 130 | 4E |

REDUCED-POWER PROGRAMMING OF MULTI-LEVEL CELL (MLC) MEMORY

BACKGROUND OF THE INVENTION

1. Field of the Invention

The current invention relates to semiconductor non-volatile memory, and in particular, to multi-level cell (MLC) electrically programmable non-volatile memory.

2. Description of the Related Art

Single-level cell (SLC) memory is electrically programmable non-volatile memory where a single memory cell is used to store one bit of data. Multi-level cell (MLC) memory is electrically programmable non-volatile memory where a single memory cell is used to store more than one bit of data. A multi-level cell may be physically substantially identical to a single-level cell, where either memory cell comprises a semiconductor field-effect transistor (FET) with a floating gate between the FET's control gate and the semiconductor substrate.

FIG. 1 shows an illustrative cross-section of exemplary memory cell 100. Memory cell 100 comprises field-effect transistor 101, which comprises control gate 102, floating gate 103, substrate 104, source 105, drain 106, and insulating layers 107 and 108. Memory cell 100 is programmed by setting the voltages on control gate 102, source 105, and drain 106, such that charge carriers cross through insulating layer 107 and/or 108 into floating gate 103. The charge carriers may cross into floating gate 103 by hot-carrier injection and/or Fowler-Nordheim (F-N) tunneling. After programming, those charge carriers substantially remain trapped on floating gate 103, unless memory cell 100 is erased. Memory cell 100 can be read by setting the voltages on control gate 102, source 105, and drain 106, so as to quantify the charge present on floating gate 103.

If memory cell 100 is used in SLC memory, then programming memory cell 100 involves placing a charge sufficiently greater than some threshold charge value on floating gate 103. Consequently, reading memory cell 100 determines whether the charge on floating gate 103 is greater than that threshold charge value or not. Thus, in SLC memory, memory cell 100 can store a one-bit binary value, e.g., '0' or '1,' where the value depends on whether floating gate 103 is determined to be charged or not.

If memory cell 100 is used in MLC memory, then programming memory cell 100 involves placing a charge on floating gate 103 that is between two threshold charge values, where the threshold charge values define charge-level bands. Note that the minimum and maximum charge-level bands can be sufficiently described by only their upper and lower threshold, respectively. For example, a four-level MLC has four charge-level bands, where (i) the lowest-energy band is bound by no charge and a first charge threshold higher than the no-charge value, (ii) the second band is bound by the first charge threshold and a second charge threshold higher than the first charge threshold, (iii) the third band is bound by the second threshold and a third charge threshold higher than the second charge threshold, and (iv) the highest-energy band is bound by the third threshold and a maximum-charge value higher than the third charge threshold. In a four-level MLC memory, memory cell 100 can store one of four values that can be represented by the symbols 0, 1, 2, and 3, where the symbol value depends on the amount of charge placed on floating gate 103. Typically, these four values are represented as equivalent to the 2-bit binary numbers '00,' '01,' '10,' and '11,' respectively. Note that, in order to clarify the difference between MLC programming symbols and other numbers, MLC programming symbols are presented in bold herein.

The programming of a multi-level cell is typically performed stepwise, where the cell's floating gate is charged up to a certain charge-level band, the charge is verified, and then the floating gate is charged up to the next band and verified, and so on, until the desired band is reached. Typically, the higher the charge level of the desired value to be stored in a multi-level cell, the greater the amount of energy needed for programming. It should be noted that alternative programming techniques may be used in view of particular features of any specific memory cell, such as type of containing memory array (e.g., NAND or NOR) or component composition. In one typical implementation, where E represents a unit of energy, substantially the following amounts of energy are used to program an erased cell (i.e., a cell storing the symbol-value 0): (i) 0E, to store 0, (ii) 1E to store 1, (iii) 2E to store 2, and (iv) 3E to store 3. Assuming a substantially uniform likelihood of any 2-bit datum, the average energy required to store 2 bits of data is 1.5E (=(0E+1E+2E+3E)/4), or 0.75E per bit.

Reading memory cell 100 in an MLC system determines within which band the charge on floating gate 103 lies and, thus, the value stored by memory cell 100. For example, if the charge level on floating gate 103 is within the second band of a four-level MLC memory, then memory cell 100 is storing a 2. It should be noted that the charge on floating gate 103 is typically determined by indirect measurement, such as by measuring the current through transistor 101 at a particular voltage setting for source 105, drain 106, and control gate 102.

SUMMARY OF THE INVENTION

One embodiment of the invention can be an electronic device comprising a multi-level cell memory comprising a plurality of m-level cells, m being an integer greater than 2, the m-level multi-level cell memory adapted to store a codeword in the plurality of m-level cells, an m-level cell being capable of being programmed to a first one of the m levels using a smaller quantity of energy than is required to program the m-level cell to a second one of the m levels, the second level being higher than the first level. The electronic device further comprising an encoder adapted to receive a k-bit segment of raw data, the encoder adapted to determine a corresponding p-symbol codeword for storing in the multi-level cell memory using p m-level cells, each cell storing one symbol, the p-symbol code word also corresponds to an n-bit segment of encoded data, k being an integer less than n, n being is an integer substantially equal to $p \cdot \log_2 m$, the determination based on the amount of energy required to store the corresponding p-symbol codeword in the multi-level cell memory.

Another embodiment of the invention can be an electronic device comprising a multi-level cell memory comprising a plurality of m-level cells, m being an integer greater than 2, the m-level multi-level cell memory adapted to store a codeword in the plurality of m-level cells, an m-level cell being capable of being programmed to a first one of the m levels using a smaller quantity of energy than is required to program the m-level cell to a second one of the m levels, the second level being higher than the first level. The electronic device further comprising a decoder adapted to (1) read a p-symbol codeword from the multi-level cell memory, the p-symbol codeword stored in p m-level cells, each cell storing one symbol, the p-symbol codeword corresponding to an n-bit segment of encoded data, n being an integer substantially equal to p·log$_2$ m, and (2) determine a corresponding k-bit segment of raw data for the p-symbol codeword, k being an integer less than n, the corresponding p-symbol codeword having been selected for the k-bit segment of raw data based on the amount of energy required to store the corresponding p-symbol codeword in the multi-level cell memory.

Yet another embodiment of the invention can be a method for programming a multi-level cell memory having a plurality of m-level cells, in an electronic device further comprising an encoder, wherein m is an integer greater than 2. The method comprises: (a) receiving, by the encoder, a k-bit segment of raw data, (b) determining, by the encoder, a corresponding p-symbol codeword for the k-bit segment of raw data based on the amount of energy required to store the corresponding p-symbol codeword in the multi-level cell memory, wherein (1) the corresponding p-symbol codeword corresponds to an n-bit segment of encoded data, (2) n is an integer substantially equal to p·log$_2$ m, and (3) k is an integer less than n, and (c) storing, by the multi-level cell memory, the p-symbol codeword using p m-level cells, wherein (1) each cell stores one symbol, and (2) programming an m-level cell to a first one of the m levels requires less energy than programming the m-level cell to a second one of the m levels, the second level being higher than the first level.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 3 shows Table 1, which shows the energy required to program two four-level cells with every possible two-symbol codeword.

FIG. 4 shows Table 2, which shows the same correlations as Table 1, but where the codewords are sorted by increasing energy required for programming.

FIG. 5 shows Table 3, which is an exemplary lookup table for k=2, where n=4, and p=2.

FIG. 6 shows Table 4, which is an exemplary lookup table for k=3, where n=4 and p=2.

FIG. 7 shows Table 5, which shows the energy required to program three four-level cells with every possible three-symbol codeword.

FIG. 8 shows Table 6, which is an exemplary lookup table for k=2, where n=6 and p=3.

FIG. 9 shows Table 7, which is an exemplary lookup table for k=3, where n=6 and p=3.

FIG. 10 shows Table 8, which is an exemplary lookup table for k=4, where n=6 and p=3.

FIG. 11 shows Table 9, which is an exemplary lookup table for k=5, where n=6 and p=3.

DETAILED DESCRIPTION

There are situations where it may be important for a device comprising MLC memory to conserve energy. This is particularly true for battery-powered devices such as battery-powered mobile devices. One way to reduce the energy used by the device in programming multi-level cells is to encode raw user data prior to storage so that, on average, less energy is used to store the encoded user data than would be used to store the corresponding raw user data. Depending on the number of levels in the multi-level cells in the MLC memory and the desired energy savings, an encoding scheme is determined where every k-bit segment of raw user data is converted into an n-bit segment of encoded user data for programming p cells of the m-level MLC memory, where k is smaller than n. The n-bit segment of encoded user data corresponds to a p-symbol codeword, where n=p·log$_2$ m for values of m that are integer powers of 2.

Figure 1:
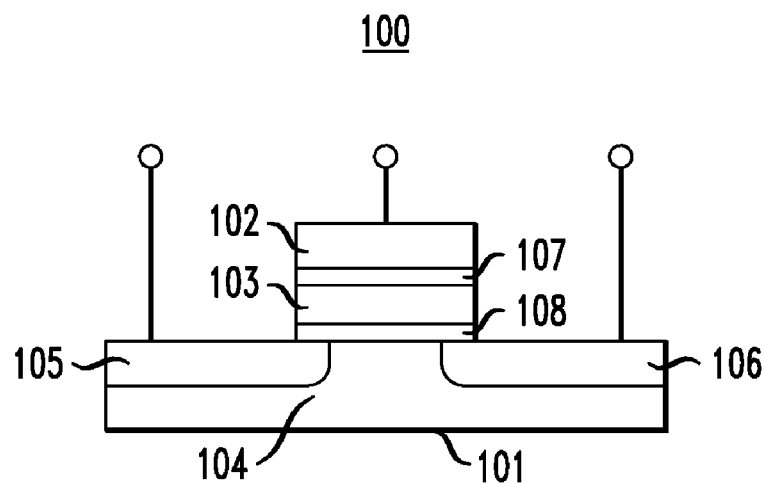
FIG. 1 shows an illustrative cross-section of an exemplary memory-cell transistor.
Figure 2:
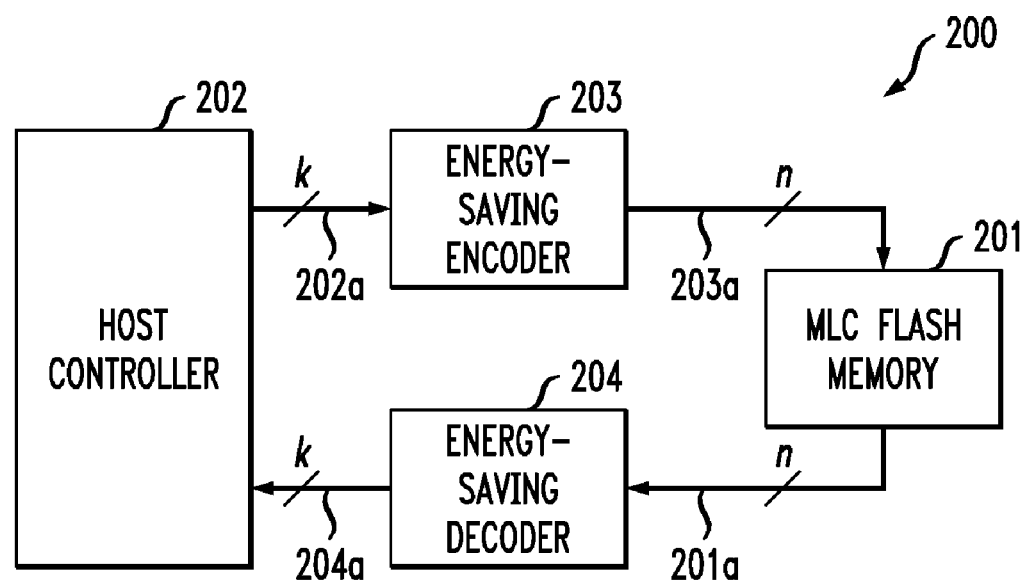
FIG. 2 shows a simplified partial block diagram of an electronic device in accordance with an embodiment of the present invention.

FIG. 2 shows a simplified partial block diagram of electronic device 200 in accordance with an embodiment of the present invention, where device 200 comprises MLC flash memory 201. MLC flash memory 201 is a four-level NAND flash memory, which comprises one or more NAND arrays of four-level memory cells. Device 200 further comprises host controller 202, energy-saving encoder 203, energy-saving decoder 204, and additional components (not shown) necessary for the proper functioning of device 200, as would be appreciated by one of ordinary skill in the art.

In programming MLC flash memory 201, host controller 202 provides a k-bit segment of raw user data to energy-saving encoder 203 via k-bit data path 202a. Energy-saving encoder then encodes the k-bit segment of raw user data into a corresponding n-bit segment of encoded user data for storing in MLC flash memory 201 via path 203a. MLC flash memory 201 uses p(=n/2) four-level cells to store the n-bit encoded segment as a corresponding p-symbol codeword. In reading from MLC flash memory 201, energy-saving decoder 204 (i) reads a p-symbol codeword as an n-bit segment of encoded user data from MLC flash memory 201 via path 201a, (ii) converts the n-bit segment of encoded user data into a corresponding k-bit segment of raw user data, and (iii) provides the k-bit segment of raw user data to host controller 202 via path 204a.

Energy-saving encoder 203 encodes using a lookup table. Energy-saving decoder 204 uses the same lookup table, but in reverse. Energy-saving decoder 204 may, instead, use a separate reverse lookup table that can optimize decoding. The lookup table has $2^k$ entries correlating the $2^k$ lowest-energy-using p-symbol codewords to corresponding k-bit raw user-data segments. Since several multi-symbol codewords can have substantially the same energy requirements for programming, multiple arrangements of a lookup table are possible for any particular values of k, p and n.

FIG. 3 shows Table 1, which shows the energy required to program two four-level cells for every possible two-symbol codeword (i.e., where n=4 and p=2).

FIG. 4 shows Table 2, which shows the same correlations as Table 1, but where the codewords are sorted by increasing energy required for programming. Using Table 2, one can generate lookup tables for various values of k. As noted above, typically, for any value of k, more than one lookup table is possible for a particular value of n.

FIG. 5 shows Table 3, which is an exemplary lookup table for k=2, where m=4, n=4, and p=2. The shorthand notation for this coding scheme, as used herein, is "(4, 2) code," where, generally, the shorthand notation is "(n, k) code." As can be seen, the average energy used to program the 2-symbol codewords corresponding to a 2-bit segment of raw user data is 1E((=0+1+1+2)E/4), or 0.5E per bit, which represent a 33% energy saving compared to the 0.75E per bit average energy consumption for un-encoded programming. Note that the symbols 11 and 20 may be used instead of 02 as the 2-symbol codeword corresponding to '11.'

FIG. 6 shows Table 4, which is an exemplary lookup table for k=3, where n=4 (i.e., (4, 3) code) and p=2. As can be seen, the average energy used to program the codewords corresponding to a 3-bit segment of raw user data is 1.75E((=0+2*1+3*2+2*3)E/8), or 0.58E per bit. The measure of energy saving achieved depends on the method used to store comparable un-encoded 3-bit data segments in four-level cells. If three four-level cells are used to store two un-encoded 3-bit data segments, then the average energy use for that would be 0.75E per bit, making the energy saving achieved by using the (4, 3) code 23%. If, instead, two four-level cells are used to store one un-encoded 3-bit data segment, then the average energy per 3-bit segment would be 2E(=(0+1+2+3+1+2+3+4)E/8) or 0.67E per bit, and, consequently, using the (4, 3) code, which uses 0.58E per bit, would yield a 13% energy saving. As noted previously, alternative codewords may be used in the lookup table while still maintaining the same average programming energy.

FIG. 7 shows Table 5, which shows the energy required to program three four-level cells for every possible three-symbol codeword (i.e., where n=6 and p=3). The three-symbol codewords are sorted by the required programming energy. Using Table 5, one can generate lookup tables for various values of k. As noted above, typically, for any value of k, more than one lookup table is possible for this particular value of n.

FIG. 8 shows Table 6, which is an exemplary lookup table for k=2, where n=6, i.e., (6, 2) code, and p=3. As can be seen, the average energy used to program the codewords corresponding to a 2-bit segment of raw user data is 0.75E((=0+1+1+1)E/4), or 0.375E per bit, which represents a 50% energy saving compared to the 0.75E per bit average energy consumption for un-encoded programming.

FIG. 9 shows Table 7, which is an exemplary lookup table for k=3, where n=6, i.e., (6, 3) code, and p=3. As can be seen, the average energy used to program the codewords corresponding to a 3-bit segment of raw user data is 1.375E((=0+3*1+4*2)E/8), or 0.46E per bit, which represents a 39% energy saving compared to the 0.75E per bit average energy consumption for un-encoded programming. As noted previously, alternative codewords may be used while maintaining the same average programming energy.

FIG. 10 shows Table 8, which is an exemplary lookup table for k=4, where n=6, i.e., (6, 4) code, and p=3. As can be seen, the average energy used to program the codewords corresponding to a 4-bit segment of raw user data is 2.06E((=0+3*1+6*2+6*3)E/16), or 0.52E per bit, which represents a 31% energy saving compared to the 0.75E per bit average energy consumption for un-encoded programming. As noted previously, alternative codewords may be used while maintaining the same average programming energy.

FIG. 11 shows Table 9, which is an exemplary lookup table for k=5, where n=6, i.e., (6, 5) code, and p=3. As can be seen, the average energy used to program the codewords corresponding to a 5-bit segment of raw user data is 2.94E((=0+3*1+6*2+10*3+12*4)E/32), or 0.59E per bit, which represents a 21% energy saving compared to the 0.75E per bit average energy consumption for un-encoded programming. As noted previously, alternative codewords may be used while maintaining the same average programming energy.

Lookup encoding/decoding tables for other values of n, p, k, and m, can be obtained in a similar manner, as would be appreciated by one of ordinary skill in the art.

Particular values of n and k can be set by (i) host controller 202 of FIG. 2, (ii) a user of electronic device 200, or (iii) a different controller. The values of n and k may be (i) preset and constant or (ii) variable and dynamically set in response to available memory in MLC flash memory 201 and/or remaining power available to electronic device 200, as determined by host controller 202.

For example, if host controller 202 determines that device 200 is running low on power and/or needs to conserve power, i.e., that reducing power consumption is currently more important than reducing memory usage in electronic device 200, then host controller 202 can dynamically decrease the code rate r, where r=k/n, in order to reduce energy used for programming. If host controller 202 later determines that sufficient power is available, i.e., that reducing memory usage is currently more important than reducing power consumption in electronic device 200, for example, if device 200 is plugged into an electrical outlet, then host controller 202 can use a higher code rate or even reprogram all of MLC flash memory 201, or a portion of it, using a higher code rate, or no encoding at all (i.e., r=1) to save memory space.

For example, if host controller 202 determines that MLC flash memory 201 is running low on free space, i.e., that reducing memory usage is currently more important than reducing power consumption in electronic device 200, then host controller 202 can dynamically increase the code rate r to use memory space more efficiently. If sufficient power is available, then host controller 202 also can reprogram all of MLC flash memory 201, or a portion of it, using a higher code rate, or no encoding at all (i.e., r=1), to reduce memory-space use.

If host controller 202 uses variable code rates to encode raw user data, then the particular code rate used for a segment of encoded user data should be determinable during decoding. In one implementation, the code rate associated with a block of cells in MLC memory 201 is stored in a header section for the block which is consulted when the encoded data in the block is read by energy-saving decoder 204. In another implementation, the code rate used is stored in a different location. In yet another implementation, the code rate is not stored but is algorithmically determined for decoding when the encoded data is read from MLC memory 201.

An embodiment of the invention has been described where the MLC memory is NAND flash memory. The invention is not limited to such an implementation. As would be appreciated by one of ordinary skill in the art, the present invention would be applicable to other types of MLC memory. For example, in one alternative implementation, the MLC memory is non-flash electrically erasable programmable read-only memory (EEPROM). In general, the invention would be applicable to any MLC memory where the energy required to program a cell to successively higher levels rises substantially consistently from level to level, e.g., where programming an erased m-level cell to a first level requires less energy than programming the erased m-level cell to a second level higher than the first level.

An embodiment of the invention has been described where the multi-level cells are four-level memory cells (i.e., m=4). The invention is not limited to four-level memory cells. As would be appreciated by one of ordinary skill in the art, the present invention would be applicable to other types of MLC memory. Typically, MLC cells have a number of levels that is an integer power of two (i.e., $2^x$ levels, where x is an integer), such as 4, 8, or 16 levels, since that makes addressing and storing binary information simpler. However, multi-level cells can have numbers of levels that are not integer powers of 2. In alternative embodiments of the invention, one or more multi-level cells have a number of charge levels other than four. In these alternative embodiments, as would be appreciated by one of ordinary skill in the art, appropriate adjustments would be required for the encoding schemes to account for the different number of levels. For example, in an implementation where m=8, k-bit raw user data would be encoded as n-bit encoded data for storage in n/3 8-level cells.

An embodiment of the invention has been described where, in setting up a lookup table for encoding and decoding, the ranking in the lookup table of several substantially energy-equivalent multi-symbol codewords does not matter among themselves, i.e., within a codeword energy band—e.g., either 02, 20, or 11 can be the fourth codeword for (4, 2) code in four-level MLC memory. In one alternative embodiment, the ranking within a codeword energy band (e.g., 2E) can be determined so as to correlate better with energy usage. For example, if it takes slightly more energy to program 02 or 20 than 11, then 11 would be the fourth codeword for four-level MLC memory where n=4 and k=2. In another alternative embodiment, other factors are used to determine the ranking of substantially-energy-equivalent multi-symbol codewords within a codeword energy band.

An embodiment of the invention has been described where the lookup table contains a set of lowest-energy-using codewords. In an alternative embodiment, the codewords used in the lookup table are not the lowest-energy using, but are lower-energy-using on average than the average for all possible codewords of the same length. Thus, selecting corresponding codewords for raw user-data segments considers the energy required to program the corresponding codewords in the MLC memory.

An embodiment of the invention has been described where the encoding and decoding are performed using lookup tables. In an alternative embodiment, a partial lookup table is used in conjunction with an algorithm to determine said correlations. In one implementation for a (4, 3) code system, a partial table containing only an ordered column of eight 2-symbol codewords—e.g., the second column of Table 4 of FIG. 6—can be used without storing the corresponding 3-bit raw data segments, since the corresponding 3-bit raw data segment can be deduced from the location in the column of the 2-symbol codeword and vice-versa. For example, if encoder 203 receives 3-bit segment '010,' then encoder 203 can determine that '010' is the third 3-bit number and encoder 203 can retrieve the third codeword from the one-column partial lookup table, i.e., the codeword 10. Additional variations are possible, as would be appreciated by one of ordinary skill in the art.

An embodiment of the invention has been described where a k-bit segment of raw user data is encoded as an n-bit segment of encoded user data for programming as a p-symbol codeword in an MLC memory, and vice-versa for decoding. In an alternative embodiment, a k-bit segment of raw user data is programmed as a p-symbol codeword corresponding to an n-bit segment, and vice-versa for reading, without an intermediary conversion into/from the corresponding n-bit segment of encoded user data.

An embodiment of the invention has been described where a four-level cell in an erased state is considered to store two-bit binary number '00,' and where increased charge levels correspond to successively higher 2-bit values. However, it should be noted that particular charge levels can be defined to correlate to any values desired. In one alternative embodiment, for example, a four-level cell in an erased state stores two-bit binary number '11,' where increased charge levels correspond to successively lower 2-bit values.

References herein to the verb "to program" and its variations in reference to memory cells, unless otherwise indicate, refer to writing data for storage on the referenced memory cell(s). It should also be noted that programming does not necessarily require an active step and may include leaving a memory cell value unchanged if its previous value is the desired value. Programming a memory cell may nevertheless include performing an active step even if the previous or default value is the desired value.

Unless indicated otherwise, the term "determine" and its variants as used herein refer to obtaining a value through measurement and, if necessary, transformation. For example, to determine an electrical-current value, one may measure a voltage across a current-sense resistor, and then multiply the measured voltage by an appropriate value to obtain the electrical-current value. If the voltage passes through a voltage divider or other voltage-modifying components, then appropriate transformations can be made to the measured voltage to account for the voltage modifications of such components and to obtain the corresponding electrical-current value.

As used herein in reference to data transfers between entities in the same device, and unless otherwise specified, the terms "receive" and its variants can refer to receipt of the actual data, or the receipt of one or more pointers to the actual data, wherein the receiving entity can access the actual data using the one or more pointers.

Exemplary embodiments have been described wherein particular entities (a.k.a. modules) perform particular functions. However, the particular functions may be performed by any suitable entity and are not restricted to being performed by the particular entities named in the exemplary embodiments.

Exemplary embodiments have been described with data flows between entities in particular directions. Such data flows do not preclude data flows in the reverse direction on the same path or on alternative paths that have not been shown or described. Paths that have been drawn as bidirectional do not have to be used to pass data in both directions.

For purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

References herein to the verb "to generate" and its variants in reference to information or data do not necessarily require the creation and/or storage of new instances of that information. The generation of information could be accomplished by identifying an accessible location of that information. The generation of information could also be accomplished by having an algorithm for obtaining that information from accessible other information.

The term "semiconductor nonvolatile memory," as used herein, refers to any type of semiconductor memory that substantially retains its stored contents after disconnection from its power supply, i.e., the stored contents can be retrieved after reconnecting the nonvolatile memory to a power supply. Examples of semiconductor nonvolatile memory include, but are not necessarily limited to (i) fuse/ antifuse semiconductor devices such as OTP memory and PROM, (ii) charge-storing semiconductor devices such as EPROM and EEPROM and flash ROM, and (iii) magnetic-information storing semiconductor devices, and (iv) optical, opto-electrical, and opto-magnetic semiconductor devices.

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing steps in a software program. Such software may be employed in, for example, a digital signal processor, microcontroller, or general-purpose computer.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. The terms "directly coupled," "directly connected," etc., imply that the connected elements are either contiguous or connected via a conductor for the transferred energy.

The use of figure numbers and/or figure reference labels in the claims is intended to identify one or more possible embodiments of the claimed subject matter in order to facilitate the interpretation of the claims. Such use is not to be construed as limiting the scope of those claims to the embodiments shown in the corresponding figures.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

I claim:

1. An electronic device comprising:
   a multi-level cell memory comprising a plurality of m-level cells, m being an integer greater than 2, the m-level multi-level cell memory adapted to store a codeword in the plurality of m-level cells, an m-level cell being capable of being programmed to a first one of the m levels using a smaller quantity of energy than is required to program the m-level cell to a second one of the m levels, the second level being higher than the first level; and an encoder adapted to receive a k-bit segment of raw data, the encoder adapted to determine a corresponding p-symbol codeword for storing in the multi-level cell memory using p m-level cells, each cell storing one symbol, the p-symbol code word also corresponds to an n-bit segment of encoded data, k being an integer less than n, n being an integer substantially equal to $p \cdot \log_2 m$, the determination based on the amount of energy required to store the corresponding p-symbol codeword in the multi-level cell memory.

2. The device of claim 1, wherein the corresponding p-symbol codeword is selected for the k-bit segment of raw data using a lookup table.

3. The device of claim 2, wherein the lookup table has $2^k$ entries correlating $2^k$ different k-bit segments to $2^k$ p-symbol codewords that require minimal amount of energy to be stored in the multi-level cell memory.

4. The device of claim 2, wherein the lookup table comprises a column of p-symbol codewords without corresponding k-bit segments of raw data.

5. The device of claim 1, further comprising a decoder adapted to:
   read the p-symbol codeword from the multi-level cell memory; and
   determine the corresponding k-bit segment of raw data for the p-symbol codeword.

6. The device of claim 1, wherein the multi-level cell memory comprises one or more NAND arrays.

7. The device of claim 1, further comprising a host controller adapted to provide the k-bit segment of raw data to the encoder, wherein:
   a coding rate, r, is equal to k/n; and
   the host controller is adapted to vary r for any subsequent k-bit segment.

8. The device of claim 7, wherein:
   the host controller is adapted to dynamically decrease r for a subsequent k-bit segment if the host controller determines that reducing power consumption is currently more important than reducing memory usage in the electronic device; and
   the host controller is adapted to dynamically increase r for a subsequent k-bit segment if the host controller determines that reducing memory usage is currently more important than reducing power consumption in the electronic device.

9. The device of claim 8, wherein the host controller is adapted to reprogram at least a portion of the multi-level cell memory, previously programmed at a first coding rate, at a second coding rate, higher than the first coding rate, if the host controller determines that reducing memory usage is currently more important than reducing power consumption in the electronic device.

10. The device of claim 7, wherein the coding rate, r, for a block of one or more m-level cells is stored in a memory location associated with the block.

11. The device of claim 1, wherein the device is a battery-powered electronic device.

12. The device of claim 1, further comprising a decoder and a host controller, wherein:
   (a) the decoder is adapted to:
      (1) read the p-symbol codeword from the multi-level cell memory; and
      (2) determine the corresponding k-bit segment of raw data for the p-symbol codeword;
   (b) the multi-level cell memory comprises one or more NAND arrays;
   (c) the host controller is adapted to:

(1) provide the k-bit segment of raw data to the encoder, wherein:
  (i) a coding rate, r, is equal to k/n; and
  (ii) the host controller is adapted to vary r for any subsequent k-bit segment;
(2) dynamically decrease r for a subsequent k-bit segment if the host controller determines that reducing power consumption is currently more important than reducing memory usage in the electronic device;
(3) dynamically increase r for a subsequent k-bit segment if the host controller determines that reducing memory usage is currently more important than reducing power consumption in the electronic device; and
(4) reprogram at least a portion of the multi-level cell memory, previously programmed at a first coding rate, at a second coding rate, higher than the first coding rate, if the host controller determines that reducing memory usage is currently more important than reducing power consumption in the electronic device;
(d) the coding rate, r, for a block of one or more m-level cells is stored in a memory location associated with the block; and
(e) the device is a battery-powered electronic device.

13. An electronic device comprising:
a multi-level cell memory comprising a plurality of m-level cells, m being an integer greater than 2, the m-level multi-level cell memory adapted to store a codeword in the plurality of m-level cells, an m-level cell being capable of being programmed to a first one of the m levels using a smaller quantity of energy than is required to program the m-level cell to a second one of the m levels, the second level being higher than the first level; and
a decoder adapted to:
  read a p-symbol codeword from the multi-level cell memory, the p-symbol codeword stored in p m-level cells, each cell storing one symbol, the p-symbol codeword corresponding to an n-bit segment of encoded data, n being an integer substantially equal to $p \cdot \log_2 m$; and
  determine a corresponding k-bit segment of raw data for the p-symbol codeword, k being an integer less than n, the corresponding p-symbol codeword having been selected for the k-bit segment of raw data based on the amount of energy required to store the corresponding p-symbol codeword in the multi-level cell memory.

14. A method for programming a multi-level cell memory having a plurality of m-level cells, in an electronic device further comprising an encoder, wherein m is an integer greater than 2, the method comprising:
(a) receiving, by the encoder, a k-bit segment of raw data;
(b) determining, by the encoder, a corresponding p-symbol codeword for the k-bit segment of raw data based on the amount of energy required to store the corresponding p-symbol codeword in the multi-level cell memory, wherein:
  (1) the corresponding p-symbol codeword corresponds to an n-bit segment of encoded data;
  (2) n is an integer substantially equal to $p \cdot \log_2 m$; and
  (3) k is an integer less than n; and
(c) storing, by the multi-level cell memory, the p-symbol codeword using p m-level cells, wherein:
  (1) each cell stores one symbol; and
  (2) programming an m-level cell to a first one of the m levels requires less energy than programming the m-level cell to a second one of the m levels, the second level being higher than the first level.

15. The method of claim 14, wherein the step of determining the corresponding p-symbol codeword for the k-bit segment of raw data comprises using a lookup table by the encoder.

16. The method of claim 14, wherein the electronic device further comprises a decoder, the method further comprising:
reading, by the decoder, the p-symbol codeword from the multi-level cell memory; and
determining, by the decoder, the corresponding k-bit segment of raw data for the p-symbol codeword.

17. The method of claim 14, wherein:
the electronic device further comprises a host controller; and
a coding rate, r, is equal to k/n, the method further comprising:
providing, by the host controller, the k-bit segment of raw data to the encoder;
varying r for a subsequent k-bit segment.

18. The method of claim 17, further comprising:
dynamically decreasing r for a subsequent k-bit segment if the host controller determines that reducing power consumption is currently more important than reducing memory usage in the electronic device; and
dynamically increasing r for a subsequent k-bit segment if the host controller determines that reducing memory usage is currently more important than reducing power consumption in the electronic device.

19. The method of claim 18, further comprising:
reprogramming at least a portion of the multi-level cell memory, previously programmed at a first coding rate, at a second coding rate, higher than the first coding rate, if the host controller determines that reducing memory usage is currently more important than reducing power consumption in the electronic device.

20. The method of claim 17, further comprising storing the coding rate, r, for a block of one or more m-level cells, in a memory location associated with the block.

* * * * *